US008413106B1

(12) United States Patent
Goossens

(10) Patent No.: US 8,413,106 B1
(45) Date of Patent: Apr. 2, 2013

(54) TRANSACTION LEVEL MODEL SYNTHESIS

(75) Inventor: Serge Goossens, Heverlee (BE)

(73) Assignee: Synopsys, Inc., Mountain View, CA (US)

( * ) Notice: Subject to any disclaimer, the term of this patent is extended or adjusted under 35 U.S.C. 154(b) by 1420 days.

(21) Appl. No.: 10/976,402

(22) Filed: Oct. 28, 2004

(51) Int. Cl.
*G06F 9/44* (2006.01)
(52) U.S. Cl. .................. 717/104; 717/106
(58) Field of Classification Search .......... 717/124–134, 717/104–113
See application file for complete search history.

(56) References Cited

U.S. PATENT DOCUMENTS

| 6,289,498 | B1 * | 9/2001 | Dupenloup | 716/18 |
| 6,477,691 | B1 * | 11/2002 | Bergamashi/Rab et al. | 716/12 |
| 6,877,139 | B2 * | 4/2005 | Daga | 716/1 |
| 7,124,376 | B2 * | 10/2006 | Zaidi et al. | 716/1 |

OTHER PUBLICATIONS

Prem P. Jain, "A Compresensive Pre-RTL IC Design Methodology", IEEE, pp. 119-126, 1995.*
Cai et al., "Transaction Level Modeling: an Overview", ACM, pp. 19-24, 2003.*
Calazans et al., "From VHDL Register Transfer Level to SystemC Transaction Level Modeling: A Comparative Case Study", IEEE, pp. 1-6, 2003.*
Prem P. Jain, "A Compresensive Pre-RTL IC Design Methodology", 1995, IEEE, pp. 119-126, Appendices A1-3.*
Preeti Ranjan Panda, "SystemC—A Modeling platform supporting multiple design abstractions", 2001, ACM, pp. 75-80.*
Alan Ma et al., "SystemC™ Utilizing SystemC for Design and Verification", Created on Jan. 10, 2004, www.model.com, Mentor Graphics, 34 pages.*
Nicolas Laine, "Research on New SoC Design Methodology using SystemC", Aug. 2005, http://microelectronics.esa.int/papers/final_nlaine.pdf, ESTEC, Netherlands, 72 pages.*
SOC Central, "Utilizing SystemC for Design and Verification", Jul. 2004, Mentor Graphics Corp, http://web.archive.org/, 2 pages.*

* cited by examiner

*Primary Examiner* — Ted T Vo
(74) *Attorney, Agent, or Firm* — Fenwick & West LLP

(57) ABSTRACT

Converting from transaction level model to register transfer level. A method comprises accessing a transaction level model description. Function calls in the transaction level model description are automatically converted to signal accesses in a register transfer level description. Interlace logic is automatically generated in the register transfer level description. The interface logic provides an interface between a bus interface and the signal accesses. The register transfer level description is stored in a computer readable medium.

34 Claims, 4 Drawing Sheets

TRANSACTION LEVEL MODEL SYNTHESIS

FIELD OF THE INVENTION

Embodiments of the present invention relate to the field of software tools to facilitate designing computer architecture. Specifically, embodiments of the present invention relate to automatically generating register transfer level (RTL) program code from a transaction level model (TLM) description of an integrated circuit.

BACKGROUND ART

Computer related technologies become more complex with each passing year. Thus, the design and verification of computer architectures such as systems on a chip (SoC) also become increasingly more challenging. It is desirable that the design engineer have available a tool that allows design description at a high level of abstraction. However, in order to verify the design, a description of the design is needed at a lower-level abstraction. Conventionally, converting from the high-level abstraction description to the low-level abstraction description is challenging, time consuming, and potentially error prone.

Transaction level modeling (TLM) is a technique to describe certain designs at a high level of abstraction. Transaction level modeling is typically used for designs in which protocol based communication is dominant. For example, TLM is often used for designs involving computer busses or network structures. Modeling in TLM can simplify design by reducing the amount of detail a designer must consider. The TLM design can be used by a simulator tool such as Bus-Simulator, which is commercially available from CoWare® of San Jose, Calif. Further, TLM can result in a fast simulation because the amount of events and information passed during simulation is reduced by the limited description details.

One lower level abstraction description that is commonly used is known as register transfer level (RTL). Unfortunately, conventionally the conversion from a TLM description to an RTL description is manual process. The manual conversion process is time consuming and error prone. Moreover, because the design and verification process involves modifying the TLM description based on the results of the verification stage, a new RTL description must be produced each time the TLM description is modified. Thus, the conventional design and verification process can be very time consuming and error prone.

SUMMARY OF THE INVENTION

Therefore, it would be advantageous to provide a method and system for TLM synthesis. It would be advantageous to provide a method and system that automatically converts a computer architecture design that is described at a high-level of abstraction to a low-level of abstraction description. It would be further advantageous to meet the above constraints while being compatible with existing technologies for developing embedded processors, systems-on-a-chip, and other electronic devices using busses.

Accordingly, embodiments of the present invention provide a method and system that automatically translate a TLM description to an RTL description. In one embodiment the behavior of the RTL description is cycle accurate, such that it is suitable for synthesis. In another embodiment the behavior of the RTL description is not cycle accurate. In the latter case, the RTL is suitable for inputting to a tool that provides behavioral synthesis, such that synthesizable RTL code is available. Embodiments of the present invention meet the above constraints while being compatible with existing technologies for developing embedded processors, systems-on-a-chip, and other electronic devices using busses.

More specifically, in one embodiment, a method of converting from a transaction level model description to a corresponding register transfer level description is provided. The method comprises accessing a transaction level model description. Function calls in the transaction level model description are automatically converted to signal accesses in a register transfer level description. Interface logic is automatically generated in the register transfer level description. The interface logic provides an interface between a bus interface of the register transfer level description and the signal accesses. The register transfer level description is stored in a computer readable medium.

Systems and computer readable media in accordance with embodiments of the present invention are also described herein. Embodiments of the present invention provide these advantages and others not specifically mentioned above but described in the sections to follow.

DETAILED DESCRIPTION OF THE INVENTION

Figure 1:
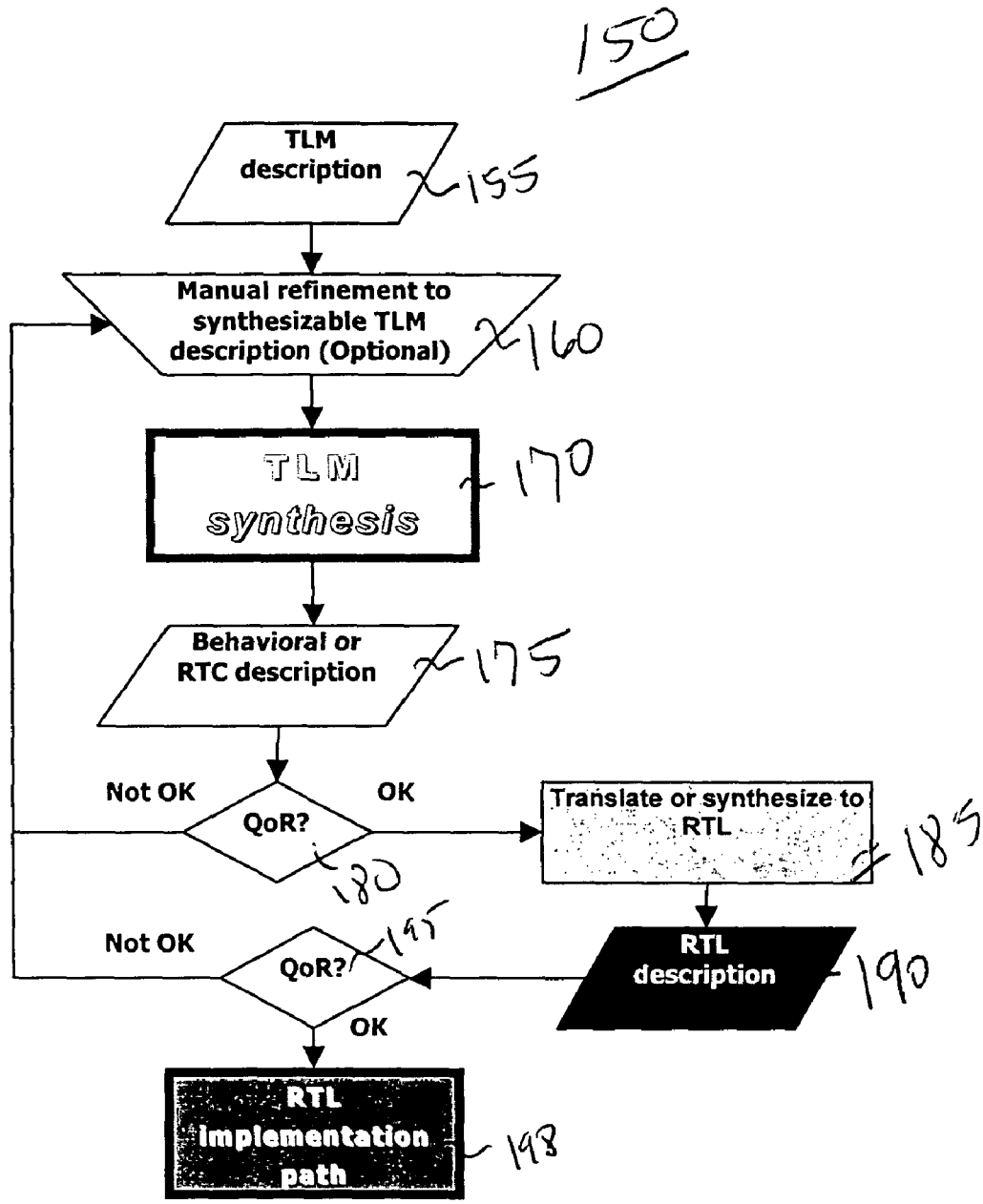
FIG. 1 is a flow diagram of a design and verification process comprising TLM synthesis in accordance with an embodiment of the present invention.

In the following detailed description of embodiments of the present invention, transaction level model synthesis, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

NOTATION AND NOMENCLATURE

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "inferring" or "receiving" or "generating" or "outputting" or "computing" or "translating" or "storing" or "determining" or "converting" or "replacing" or "modifying" or "accessing" or "activating" or "simulating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

TLM Synthesis

Embodiments of the present invention automatically generate an RTL description from a TLM description. The communication portion of the RTL description that is generated by embodiments of the present invention are pin accurate and cycle accurate. In one implementation, the behavior portion of the RTL description is cycle accurate. In another implementation, the behavior part of the RTL description is not cycle accurate. In some embodiments in accordance with the present invention, the RTL description is compliant with RTC (Register Transfer Level SystemC®). However, the present invention is also suitable for automatically generating from a TLM description an RTL description that is compliant with, for example, Verilog or VHDL.

Referring now to FIG. 1, a flow diagram is depicted of a design and verification process 150 comprising TLM synthesis in accordance with an embodiment of the present invention. Embodiments of the present invention are practiced in the TLM synthesis step 170. However, the present invention is not limited to being used in the design and verification process 150 depicted in FIG. 1.

The process 150 inputs a raw TLM description 155. The communication portion of the raw TLM is description 155 comprises timing information. However, the behavior portion of the raw TLM description 155 does not necessarily comprise timing information. Therefore, timing information may be provided for the behavior portion, in optional step 160, which may be performed manually.

In one embodiment, the raw TLM description 155 is re-written in step 160 to fit a synthesizable subset of TLM. For example, in one embodiment, the sendDelayed TLM API call is not supported in the synthesizable subset of TLM. The sendDelayed call in the TLM API call is very useful for pure modeling purposes. It allows avoiding explicit state machines or simulation penalties through "wait" calls. The advantage of this call is that the scheduling of this event is immediately passed to the block that will receive the event, which enhances simulation speed. However, since the sendDelayed TLM API is not required for simulation it can be left out of the synthesizable subset.

Alternatively, the sendDelayed TLM API can be included in the synthesizable subset, if desired. In one implementation, the 'sendDelayed' API is handled by replacing the sendDelayed call in the TLM description by a "wait( ) send( )" combination. It will be understood that the present invention is not limited to any particular subset of TLM and that techniques may be used to include all TLM constructs (e.g., API calls) in the input TLM description.

The synthesizable TLM, which has timing information for both the communication portion and the behavior portion, is input to a TLM synthesis tool in step 170 in accordance with an embodiment of the present invention.

The TLM synthesis step 170 automatically generates an RTC description 175 that is both pin-accurate and cycle accurate for the communication portion, in this embodiment. However, the behavior portion in the RTC description 175 may or may not be cycle accurate. For example, in one embodiment the behavior portion is cycle accurate, while in another embodiment, the behavior portion is not cycle accurate. In process 150, the output of the TLM synthesis step 170 is an RTL description 175 that is compliant with SystemC® (e.g., the description is RTC). However, the present invention is not limited to the output of the TLM synthesis step 170 being RTC. Thus, for example, in other implementations the TLM synthesis step 170 automatically generates RTL code that is compliant with either Verilog or VHDL.

The RTC description 175 is analyzed in optional step 180 to determine if the quality of result (QoR) is acceptable. If refinements to the RTC description 175 are desired, the process 150 returns to step 160. In step 160, additional manual refinement of the TLM description may be performed. Step 170 is then performed to automatically generate a new RTC description 175. Thus, modifications to the design are easily effected because the design modifications are made at a high-level of abstraction (e.g., TLM) and there is no need to manually translate from the TLM description to the RTC description.

When the quality of result of the RTC description 175 is satisfactory per step 180, then the RTC description 175 may be further refined by inputting the RTC description into a tool that is able to convert RTC to RTL code that is compliant with either Verilog or VHDL. This is reflected in step 185 of process 150. Further, step 185 may perform behavioral synthesis, depending on the original TLM description. As previously discussed, the behavior of RTC description that the TLM synthesis tool 170 outputs may or may not be cycle accurate. (Note that the communication will be both pin and cycle accurate.) In the case in which the behavior in the RTC description 175 is not cycle accurate, then step 185 performs behavioral synthesis to produce RTL code that is cycle accurate for the behavior portion. Step 185 may be performed by a tool such as Cynthesizer™, which is commercially available from Forte Design Systems of San Jose, Calif. It is appreciated that step 185 is not a requirement of the present invention.

In step 195, the RTL description 190 is analyzed to determine if the quality of result is acceptable. If not, the process 150 returns to step 160 for additional manual refinements to the TLM description. Then, the process 150 automatically generates a new RTC description 175 for further analysis. when the quality of result is acceptable, the process 150 continues down the RTL implementation path 198 to generate a gate level description. As previously discussed step 185 is not a requirement of the present invention. For example, in an embodiment of the present invention the TLM synthesis 170 automatically generates RTL code that may be input to the RTL implementation path 198.

Figure 2:
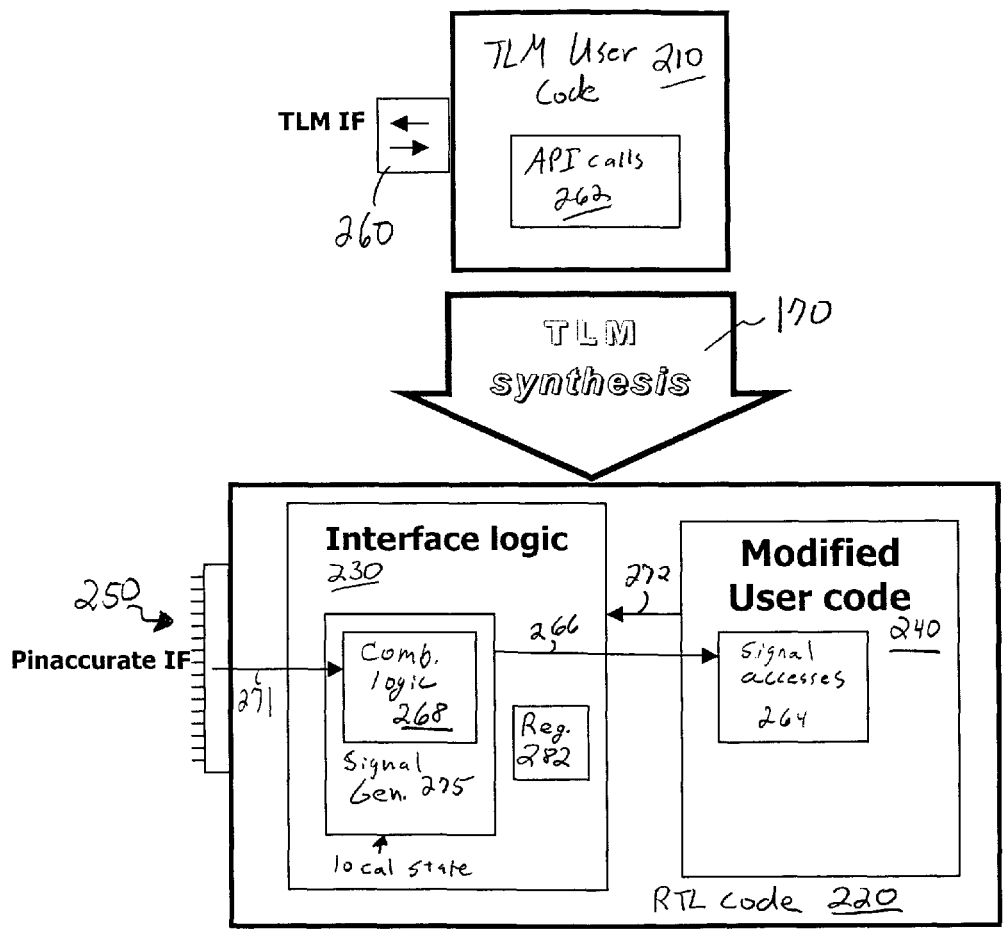
FIG. 2 is a diagram illustrating modules of RTL code automatically generated in accordance with an embodiment of the present invention.

Referring now to FIG. 2, an embodiment of the present invention inputs TLM user code 210 and outputs RTL code 220 that comprises a pin-accurate interface 250, interface logic 230, and a modified version of the user code 240 in RTL. The interface logic 230 provides an interface between the AHB pin-accurate interface 250 and the modified user code 240. Thus, the interface logic 230 serves as a bridge between the pin-accurate interface 250 and the timing requirements of both the bus and the modified user code 240.

The TLM user code 210 may describe, for example, a peripheral device that interfaces with a bus. The timing information for the TLM user code 210 originates from the bus. For example, the TLM user code 210 queries the bus to determine when it can send an address or data. In other words the peripheral (which is described by the TLM user code 210) does not know the timing details of the bus protocol. Those are entered through the AHB TLM interface 260, in this embodiment. However, the present invention is not limited to AHB. Thus, the TLM user code 210 knows when an address arrives, knows when the peripheral can send data, etc. Embodiments of the present invention add timing information to interface logic 230 in the RTL code 220. In order to achieve the interface logic 230 there should be sufficient separation of communication and behavior in the TLM user code 210 so that the communication can be synthesized independently.

In order to automatically generate the modified user code 240, embodiments of the present invention input the TLM user code 210 and modify the TLM user code 210 to "use signals" and clock or event threads. For example, references to TLM ports (e.g., API calls 262) in the TLM user code 210 are removed and replaced by signal accesses 264 in the modified user code 240. The signals accesses in the RTL code have the same semantics as the TLM API call.

The interface logic 230 has signal generation logic 275, which generates the signals 266 that are accessed by the signal accesses 264. The signal generation logic 275 has combinational logic 268 that builds the signals 266 from signals 271 on the bus (e.g., AHB interface 250). The signal generation logic 275 can also build the signals 266 based on local state. Exemplary RTL code is provided below illustrating combinational logic 268 for generating signals 266 based on signals 271 from a bus (e.g., pin accurate interface 250) and also based on local state. The interface logic 230 also has registers 282 which are automatically inferred by the TLM process 170. The inferred registers 282 may be used to store protocol content. For example, the inferred registers may store attributes of transfers, although their use is not so limited. Exemplary RTL code having inferred registers is provided below. The modified user code 240 sends information to the interface logic 230 via signals 272.

While FIG. 2 depicts the bus interfaces (250, 260) as being the Advanced Microcontroller Bus Architecture (AMBA™) Advanced High Performance Bus (AHB), the present invention is not so limited. Those of ordinary skill in the art will appreciate that the'concepts of the present invention are applicable to other well known bus protocols, such as, but not limited to, the IBM CoreConnect™ bus architecture or the AMBA™ Advanced Peripheral Bus (APB).

Figure 3:
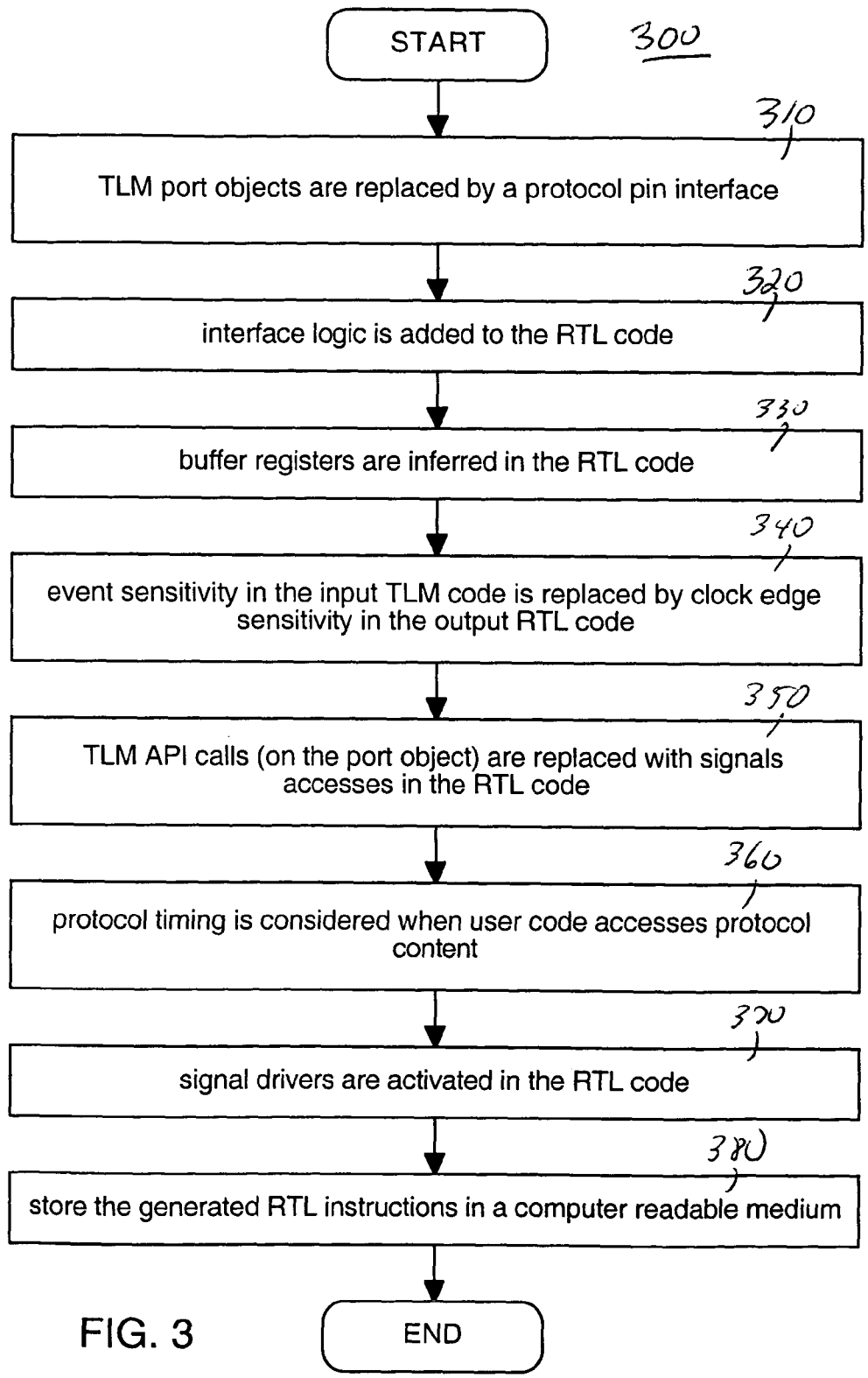
FIG. 3 is a flowchart of a process of synthesizing an RTL description from a TLM description in accordance with an embodiment of the present invention.

FIG. 3 is a flowchart of a computer-implemented process 300 of synthesizing an RTL description from a TLM description in accordance with an embodiment of the present invention. Process 300 will be discussed in conjunction with exemplary TLM code and exemplary RTC code. The exemplary code has references to pins, signals and the like in an AHB protocol. However, the present invention is not limited to AHB. While the exemplary code is written in SystemC®, the present invention is not limited to SystemC®. In step 310, TLM port objects are replaced by a protocol pin interface. For example, the exemplary TLM code in Table I has a port object. The TLM specifies the width of the address and the data in the arguments as being 12 bits and 32 bits, respectively.

TABLE I

"AHBLiteTarget_inoutslave_port< 12, 32> p"

The port object is automatically replaced by the following exemplary protocol pin interface in the RTL code in TABLE II. The pin-widths for address and data in the RTL program code are tailored to match the TLM code. For example, the "p_HADDR" is 12 bits wide and the "p_HWDATA" and "p_HRDATA" are 32 bits in the RTL program code.

TABLE II

| sc_in< sc_uint< 12> > | p_HADDR; |
| sc_in< sc_uint< 32> > | p_HWDATA; |
| sc_out< sc_uint< 32> > | p_HRDATA; |
| sc_in< bool> | p_HWRITE; |
| sc_in< sc_uint< 2> > | p_HTRANS; |
| sc_out< sc_uint< 2> > | p_HRESP; |
| sc_in< bool> | p_HREADYin; |
| sc_out< bool> | p_HREADYout; |
| sc_in< bool> | p_HSEL; |
| sc_in< sc_uint< 3> > | p_HSIZE; |

Further, embodiments of the present invention minimize the width of pins automatically generated interface logic. For example, the "p_HTRANS" could be either "1-bit" or "2-bits" in accordance with an AMBA™ specification. An embodiment of the present invention deduces from the usage of the TLM code that, in this case, the"p_HTRANS" should be 2-bits. However, if the usage of the TLM code did not need two-bits, then "p_HTRANS" would be 1-bit.

Further, embodiments of the present invention minimize the number of pins in the automatically generated interface logic Thus, some pins may be omitted from the interface logic, in accordance with an embodiment of the present invention. For example, the automatically generated pin interface in Table II does not contain "p_HPROT." If the "p_HPROT" was used, there would be an entry in Table II such as, "sc_in <sc_uint<4>> p_HPROT". Note that this is an optional pin in an AHB protocol. In this case, an analysis of the TLM code determined that the "p_HPROT" pin is not needed. Therefore, this pin is not generated so as to minimize the interface logic. This minimization is typically only done for input pins.

In step 320, interface logic is added to the RTL code. The following are four exemplary SystemC® methods added to the RTL code. The added interface logic comprises registers, which may be modeled as clocked methods. The added interface logic also comprises combinational logic, which is modeled as a method sensitive to its inputs. The interface logic generates signals, which will be described more fully below.

The following RTL functions are available to control receiving of transfers and for auxiliary variables. Table III provides an example of the previously described combinational logic in the interface logic (FIG. 2) and is modeled as a method sensitive to its inputs.

TABLE III

```
SC_METHOD (p_setCanReceiveAddrTrf);
    sensitive << p_HREADYin
        << p_HSEL
        << p_HTRANS
        << p_HWRITE;
```

TABLE III-continued

```
     p_setCanReceiveAddrTrf ( ) {
         p_canReceiveAddrTrf = (bool(0×2 &
p_HTRANS.read ( ).to_uint ( )) &
p_HSEL.read ( ) & p_HREADYin.read ( ));
         p_canReceiveWAddrTrf = (bool(0×2 &
p_HTRANS.read ( ).to_uint ( )) &
p_HSEL.read ( ) & p_HREADYin.read ( )) & (p_HWRITE.read ( ));
         p_canReceiveRAddrTrf = (bool(0×2 &
p_HTRANS.read ( ).to_uint ( )) &
p_HSEL.read () & p_HREADYin.read ( )) & (! (p_HWRITE.read ( )));
         p_canSendRDataTrf = (bool(0×2 &
p_HTRANS.read ( ).to_uint ( )) &
p_HSEL.read ( ) & p_HREADYin.read ( )) & (! (p_HWRITE.read ( )));
     }
```

Some TLM API calls require state information to be stored. The TLM API provides cross-references to refer to another transfer belonging to the same transaction. The most common use of this feature is to refer to the address transfer starting from a read or write data transfer. Embodiments of the present invention automatically infer registers to store attributes of transfers, if required, to implement the cross-reference feature in case these cross-references are used. The following clocked method in Table IV is an example of a register that has been inferred in the exemplary RTL code, in accordance with an embodiment of the present invention.

TABLE IV

```
     SC_METHOD (p_setCanReceiveWDAtaTrfReg);
         sensitive_pos << clk;
         sensitive_neg << nRst;
     p_setCanReceiveWDAtaTrfReg ( ) {
         if (!nRst ) {
             p_canReceiveWDataTrfReg = false;
         } else {
             p_canReceiveWDataTrfReg = p_canReceiveWAddrTrf;
         }
     }
```

The clocked method in Table V is another example of registers that have been inferred in the exemplary RTL code, in accordance with an embodiment of the present invention. In this example, "HSIZE" and "HADDR" are conditionally stored.

TABLE V

```
     SC_METHOD (p_setAddrTrfReg);
         sensitive_pos << clk;
         sensitive_neg << nRst;
     p_setAddrTrfReg ( ) {
         if (!nRst ) {
             p_addrTrfAddressReg = 0;
             p_addrTrfSizeReg = 0;
         } else {
             if (p_canReceiveAddrTrf ) {
                 p_addrTrfAddressReg = p_HADDR.read ( );
                 p_addrTrfSizeReg = p_HSIZE.read ( );
             }
         }
     }
```

The exemplary function in TABLE VI drives the signal p_canSendEotTrf true when the end of transaction transfer can be sent in the exemplary RTL code, in accordance with an embodiment of the present invention.

TABLE VI

```
     SC_METHOD (p_setCanSendEotTrf);
         sensitive << p_HREADYin
             << p_HSEL
```

TABLE VI-continued

```
             << p_HTRANS;
     p_setCanSendEotTrf ( ) {
         p_canSendEotTrf = bool(0×2 & p_HTRANS.read ( ).to_uint ( )) &
p_HSEL.read ( ) & p_HREADYin.read ( );
     }
```

In step 330 of FIG. 3, buffer registers are inferred in the RTL code. The inferring of buffer registers may be performed as a part of the automatic generation of the interface logic. For example, the method "SC_METHOD (p_setAddrTrfReg)" in Table V is an example of automatically inferring registers. This is done because in TLM the address and data are used at the same time. However, in the RTL code, the address and the data are not present on the bus at the same time. Therefore, there is inferred storage for the address in the RTL code. More generally, protocol content is stored in the inferred storage.

In step 340, event sensitivity in the input TLM code is replaced by clock edge sensitivity in the output RTL code. For example, the following four exemplary methods in TABLE VII in the TLM code have event sensitivity. For example, the TLM code may have event sensitivity such that it may be used with a tool such as BusSimulator, which is commercially available from CoWare® of San Jose, Calif. The BusSimulator is event sensitive for the following exemplary TLM methods.

TABLE VII

```
     SC_METHOD( addrTr);
         sensitive << p.getReceiveAddrTrfEventFinder( );
     SC_METHOD( wDataTr);
         sensitive << p.getReceiveWriteDataTrfEventFinder( );
     SC_METHOD( rDataTr);
         sensitive << p.getSendReadDataTrfEventFinder( );
     SC_METHOD( eotTr);
         sensitive << p.getSendEotTrfEventFinder( );
```

The following four corresponding methods in TABLE VIII in the automatically generated RTL code have clock edge sensitivity.

TABLE VIII

```
     SC_METHOD( addrTr);
         sensitive << clk.pos( );
     SC_METHOD( wDataTr);
         sensitive << clk.pos( );
     SC_METHOD( rDataTr);
         sensitive << clk.pos( );
     SC_METHOD( eotTr);
         sensitive << clk.pos( );
```

In step 350, TLM API calls (on the port object) are replaced with signals accesses in the RTL code. The signals accesses in the RTL code have the same semantics as the TLM API call. The signals accesses respond to signals that are generated by the interface logic, either directly from signals on the bus using combinational logic or based on local state. Note that in TLM, state information is stored in the transactional bus simulator (TBS), while in a pin accurate (PA) implementation (e.g., the automatically generated RTL code) it is local in the peripheral.

For example, the following TLM code in TABLE IX has the TLM API call "p.getAddrTrf".

TABLE IX

```
// ADDR handler
void computationAccelerator::addrTr( ) {
    if( p.getAddrTrf( )) {
        cout << name( ) << " " << sc_time_stamp( )
            << " sample address now!" <<
        endl;
    }
}
```

The following RTL code in TABLE X replaces the TLM API call "p.getAddrTrf" with the signal access "p_canReceiveAddrTrf.read". Thus, the RTL code defines "p_canReceiveAddrTrf.read" to have the same semantics as p.getAddrTrf" in the TLM API.

TABLE X

```
// ADDR handler
void computationAccelerator::addrTr( ) {
    if( p_canReceiveAddrTrf.read( )) {
        cout << name( ) << " " << sc_time_stamp( )
            << " sample address now!" <<
        endl;
    }
}
```

Table XI provides another example of TLM code and corresponding RTL code with TLM API calls replaced with signal accesses in the RTL code. The following TLM code has an API call p.canReceiveWriteDataTrf.

TABLE XI

```
// WDATA handler
void computationAccelerator::wDataTr( ) {
    if( p.canReceiveWriteDataTrf( )) {
        cout << name( ) << " " << sc_time_stamp( ) <<
            " sample write data now!
        TRUE" << endl;
    } else {
        cout << name( ) << " " << sc_time_stamp( ) <<
            " sample write data now!
        FALSE" << endl;
    }
}
```

The following RTL code in Table XII has a corresponding signal access p_canReceiveWDataTrfReg.read.

TABLE XII

```
// WDATA handler
void computationAccelerator::wDataTr( ) {
    if( p_canReceiveWDataTrfReg.read( )) {
        cout << name( ) << " " << sc_time_stamp( ) <<
            " sample write data now!
        TRUE" << endl;
    } else {
        cout << name( ) << " " << sc_time_stamp( ) <<
            " sample write data now!
        FALSE" << endl;
    }
}
```

In step 360 of FIG. 3, protocol timing is considered when user code accesses protocol content. For example, the following TLM code has "const signed int data=p.WriteDataTrf->getWriteData( )" The exemplary RTL code below the TLM code replaces this with "const signed int data=p_HWDATA.read( )" This allows sampling of the pins, since the data is present on the pins when this piece of code is executed.

Further, in the following exemplary code a buffer register is inferred since the address is not present on the pins when the RTL code is executed. Thus, the following TLM code has "const unsigned int address=0xfff & (p.WriteDataTrf->getAddrTrf( )->getAddress( )." The RTL code below the TLM code has a corresponding "const unsigned int address=0xfff & (p_addrTrfAddressReg.read( ))."

The exemplary TLM code is in Table XIII.

TABLE XIII

```
void computationAccelerator::busHandler( ) {
    if( ! nRst ) { // reset
        computeKick = false ;
        cout << sc_time_stamp( ) << " RESET busHandler" << endl ;
    } else { // clocked
        // computeKick is asserted for one cycle when last input is written
        computeKick = false;
        if( p.getWriteDataTrf( )) {
            // if( false ) {
            cout << name( ) << " " << sc_time_stamp( ) << " busHandler
getWriteData" << endl;
            const signed int data = p.WriteDataTrf->getWriteData( );
            const unsigned int address
                = 0xfff & ( p.WriteDataTrf->getAddrTrf( )->getAddress( ));
            switch( address ) {
                case 0x000 : ir0 = data ; break ;
                case 0x010 : ir1 = data ; break ;
                case 0x020 : ir2 = data ; break ;
                case 0x030 : ir3 = data ; break ;
                case 0x040 : ir4 = data ; break ;
                case 0x050 : ir5 = data ; break ;
                case 0x060 : ir6 = data ; break ;
                case 0x070 :
                    ir7 = data ;
                    cout << sc_time_stamp( ) << " last write => compute kick"
                        << endl ;
                    computeKick = true;
                    break ;
                default: assert(0); break ;
            }
        }
    }
}
```

The following exemplary RTL code in TABLE XIV corresponds to the above TLM code and demonstrates taking into account access timing for content.

TABLE XIV

```
void computationAccelerator::busHandler( ) {
    if( ! nRst ) { // reset
        computeKick = false ;
        cout << sc_time_stamp( ) << " RESET busHandler" << endl ;
    } else { // clocked
        // computeKick is asserted for once cycle when last input is written
        computeKick = false;
        if( p_canReceiveWDataTrfReg.read( )) {
            // if( false ) {
            cout << name( ) << " " << sc_time_stamp( ) << " busHandler
getWriteData" << endl;
            const signed int data = p_HWDATA.read( );
            const unsigned int address
                = 0xfff & ( p_addrTrfAddressReg.read( ));
            switch( address ) {
                case 0x000 : ir0 = data ; break ;
                case 0x010 : ir1 = data ; break ;
                case 0x020 : ir2 = data ; break ;
                case 0x030 : ir3 = data ; break ;
                case 0x040 : ir4 = data ; break ;
                case 0x050 : ir5 = data ; break ;
                case 0x060 : ir6 = data ; break ;
                case 0x070 :
                    ir7 = data ;
                    cout << sc_time_stamp( ) <<" last write => compute kick"
                        << endl ;
                    computeKick = true;
```

TABLE XIV-continued

```
        break ;
        default: assert(0); break ;
      }
    }
  }
}
```

In step 370 of FIG. 3, signal drivers are activated in the RTL code. The TLM API has a mechanism that can change the state of the system when no API call is made. An example of this is to infer wait states by not sending the end of transaction transfer when this transfer can be sent. To effect the change in state, signals should be changed in a pin accurate implementation without a TLM API function being called. To implement this behavior, an entry function is automatically added to the RTL code. TABLE XV illustrates the corresponding RTL code that is automatically generated.

TABLE XV

```
p_entryFunction ( ) {
    const sc_uint< 2 > AHB_OKAY (0);
        p_response = AHB_OKAY;
        p_HRESP.write (AHB_OKAY);
        p_HREADYout.write (false);
}
```

Step 380 of FIG. 3 is to store the generated RTL instructions in a computer readable medium. The process 300 then ends. The instructions may be input to commercially available tools to generate gate level instructions, if desired.

Exemplary TLM Methods

For purposes of illustration, some examples of TLM methods are presented. Following are several examples of transfer sensitive methods. An exemplary clocked method is provided below the exemplary transfer sensitive methods. The body of the transfer sensitive methods should contain the appropriate get function for the transfer. This is to be able to access the attributes of the transfer. For synthesis this "get" statement goes in an "if" statement, because transfer sensitive methods are mapped to clocked methods. Hence, an if port.getXTrf( ) encloses the actual code. An address transfer handler is typically coded as in Table XVI.

TABLE XVI

```
void computationAccelerator::addrTr( ) {
    if( p.getAddrTrf( )) {
        // ADDR handler
    }
}
```

Table XVII illustrates a typical skeleton for a write data transfer handler.

TABLE XVII

```
void computationAccelerator::wDataTr( ) {
    if( p.getWriteDataTrf( )) {
        // WDATA handler
    }
}
```

Table XVIII provides an example a complete read data transfer handler.

TABLE XVIII

```
void computationAccelerator::rDataTr( ) {
    if( p.getReadDataTrf( )) {
        const unsigned int address
            = 0xfff & ( p.ReadDataTrf->getAddrTrf( )->getAddress( ));
        unsigned int data ;
        switch( address ) {
            case 0x100 : data = or0 ; break ;
            case 0x110 : data = or1 ; break ;
            case 0x120 : data = or2 ; break ;
            case 0x130 : data = or3 ; break ;
            case 0x140 : data = or4 ; break ;
            case 0x150 : data = or5 ; break ;
            case 0x160 : data = or6 ; break ;
            case 0x170 : data = or7 ; break ;
            default: assert(0); break ;
        }
        p.ReadDataTrf->setReadData( data);
        p.sendReadDataTrf( );
    }
}
```

TABLE XIX provides an exemplary end of transaction transfer handler is shown below.

TABLE XIX

```
void computationAccelerator::eotTr( ) {
    if( p.getEotTrf( )) {
        p.EotTrf->setStatus( tlmOk );
        p.sendEotTrf( );
    }
}
```

The TLM code may also include clocked methods. In a clocked method, the get transfer calls will typically be coded in an "if" statement. An example of a write data transfer handler in a clock method is shown in Table XX.

TABLE XX

```
void computationAccelerator::busHandler( ) {
    if( ! nRst ) { // reset
        computeKick = false ;
    } else { // clocked
        // computeKick is asserted for once cycle when last input is written
        computeKick = false;
        if( p.getWriteDataTrf( )) {
            const signed int data = p.WriteDataTrf->getWriteData( );
            const unsigned int address
                = 0xfff & ( p.WriteDataTrf->getAddrTrf( )->getAddress( ));
            switch( address ) {
                case 0x000 : ir0 = data ; break ;
                case 0x010 : ir1 = data ; break ;
                case 0x020 : ir2 = data ; break ;
                case 0x030 : ir3 = data ; break ;
                case 0x040 : ir4 = data ; break ;
                case 0x050 : ir5 = data ; break ;
                case 0x060 : ir6 = data ; break ;
                case 0x070 : ir7 = data ; computeKick = true; break ;
                default: assert(0); break ;
            }
        }
    }
}
```

Note that the computeKick in the above clocked method is used to communicate between the bus handler method and the clocked thread for the behavior. If the bus handler method is clocked, level sensitive logic can be used. In case the bus handler is coded in transfer sensitive methods, then edge triggered logic may be used for this communication.

Ports Declared as Members of a Module

In one embodiment of the present invention, ports in the TLM description should be declared as members of a module in order for the ports to be analyzed and converted to signals in the RTL code. This is because in SystemC® modules have ports and it is generally not logical for ports to exist outside of modules. Pointers or references to ports are not handled, in this embodiment, as this would require substantial program analysis and bring limited value. Table XXI provides an example of port declaration in a TLM description.

TABLE XXI

```
SC_MODULE( computationAccelerator ) {
    // the port p is handled by the TLMRefiner
    AHBLiteTarget_inoutslave_port< 12, 32> p;
    // the pointer to port q is not handled by the TLMRefiner
    AHBLiteTarget_inoutslave_port< 12, 32> *q;
};
```

Code Transformations Start at a Port Reference or a Call to Wait ( )

In one embodiment, it is assumed that TLM calls explicitly start with a reference to the port that they address or a call to wait( ). Thus, pointers to individual transfers are not considered in this embodiment. This is motivated by limiting the amount of program analysis required and preserving the readability in the generated code. Table XXII provides exemplary TLM code explicitly starting with a reference to the port it addresses.

TABLE XXII

```
const unsigned int address =
p.ReadDataTrf->getAddrTrf( )->getAddress( );
    // the following code will not be handled:
typedef AMBA_AHBLiteTarget_AddrTrf_Target_inout_RO_if<
a, d> AddressTrf;
AddressTrf *addressTrf = p.ReadDataTrf->getAddrTrf( );
    address = addressTrf->getAddress( );
```

All timing should be explicitly coded

In one embodiment it is assumed that all timing info is explicitly coded. For example, wait( ) calls are used in threads. This will not change the timing characteristics of the code. A typical example is using a two cycle response in AHB, as illustrated in Table XXIII. Note that sending an error response in AHB takes one cycle longer than an OK response and that is explicitly reflected in the input TLM code.

TABLE XXIII

```
if( p.getEotTrf( )) {
    p.EotTrf->setStatus( tlmOk );
    p.sendEotTrf( );
}
if( p.getEotTrf( )) {
    p.EotTrf->setStatus( tlmError );
    p.sendEotTrf( );
    wait( );
}
```

Transfer Attributes are Read Before the First Wait ( ) Call.

In one embodiment, if transfer attributes are read, they are read between receiving the transfer and the next wait( ) call. This arises because the pointer returned by a getXTrf( ) call in the TLM API is only guaranteed to be valid for one clock cycle.

A THREAD or CTHREAD Contains an Endless Loop.

In System C, every THREAD or CTHREAD body contains an endless loop. The forms in Table XXIV are recognized in one embodiment. Other forms of infinite loops are not recognized in this embodiment. This assumption limits the amount of program analysis.

TABLE XXIV

```
for( ;;) { . . . }
while( 1) { . . . }
while( true) { . . . }
```

Request Modes

Only reqUntilUnreq is supported in one embodiment. This is done to minimize the amount of logic inferred and results in the following straightforward refinements in AHB. These refinements imply that in the pin accurate RTL code only the last assignment is relevant. Hence, only one transfer related to request for a port "p" can be sent per clock cycle, as illustrated in Table XXV.

TABLE XXV

```
p.sendReqTrf( ) is replaced by p_HBUSREQ.write( true )
p.sendUnReqTrf( ) is replaced by p_HBUSREQ.write( false )
```

Exemplary Computer Platform

Figure 4:
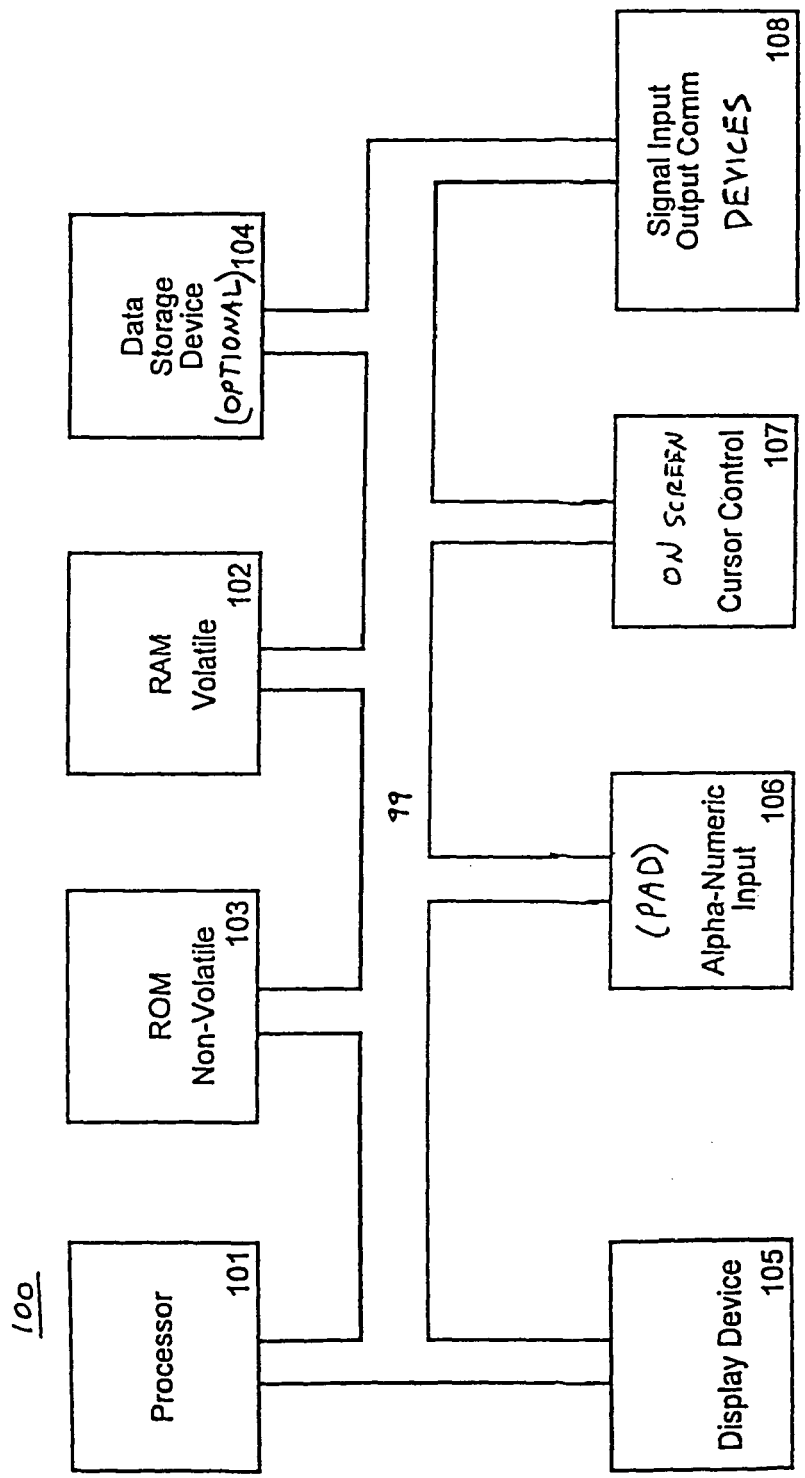
FIG. 4 is an exemplary computer system that may serve as a platform upon which embodiments of the present invention may be executed.

FIG. 4 illustrates circuitry of an exemplary computer system 100, which may form a platform for embodiments of automatically generating an RTL description from a TLM description. Computer system 100 includes an address/data bus 99 for communicating information, a central processor 101 coupled with the bus for processing information and instructions, and a computer readable medium coupled with the bus 99 for storing information and instructions for processing by the central processor 101. The computer readable medium of the exemplary computer system 100 includes a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. The computer readable medium of the exemplary computer system 100 also includes an optional data storage device 104 (e.g., a magnetic or optical disk and disk drive) coupled with the bus 99 for storing information and instructions.

With reference still to FIG. 4 system 100 also includes an alphanumeric input device 106 including alphanumeric and function keys coupled to bus 99 for communicating information and command selections to central processor unit 101. System 100 also includes a cursor control device 107 coupled to bus 99 for communicating user input information and command selections to central processor unit 101. System 100 of the present embodiment also includes a display device 105 coupled to bus 99 for displaying information. A signal input/output communication device 108 coupled to bus 99 provides communication with external devices.

The preferred embodiment of the present invention, transaction level model synthesis, is thus described. While the present invention has been described in particular embodiments, it should be appreciated that the present invention should not be construed as limited by such embodiments, but rather construed according to the below claims.

What is claimed is:

1. A computer implemented method comprising:
   a) accessing a transaction level model description of an integrated circuit;
   re-writing the transaction level model description into a synthesizable subset of the transaction level model description including a communication portion comprising timing information and a behavioral portion wherein the communication portion and the behavior portion of the transaction level model description are separate so that the communication portion can be synthesized independently;
b) automatically converting function calls in the synthesizable subset of the transaction level model description to signal accesses in a register transfer level description;
c) automatically generating interface logic in the synthesizable subset of the register transfer level description, said interface logic, comprising an interface between a bus interface and the signal accesses, wherein the interface logic includes combinational logic of a signal generator and butler registers, wherein the buffer registers are modeled as clock methods and the combination logic is modeled as a method sensitive to its inputs, and wherein buffer registers are inferred and one or more buffer registers store protocol content to implement a cross-reference to another transfer belonging to a same transaction; and
d) storing the register transfer level description including said signal accesses and said interface logic between said bus interface and said signal accesses in a computer readable medium.

2. The method of claim 1, further comprising inferring said buffer registers in the register transfer level description from the transaction level model description.

3. The method of claim 2, further comprising storing protocol content in said buffer registers.

4. The method of claim 3, wherein said protocol content comprises an address.

5. The method of claim 1, further comprising replacing event sensitivity in the transaction level model description with clock edge sensitivity in the register transfer level description.

6. The method of claim 1 wherein said interface logic is operable to generate signals that are accessible by the signal accesses.

7. The method of claim 6, wherein said combinational logic is operable to generate said signals.

8. The method of claim 6, wherein said interface logic is operable to generate said signals based on local state.

9. The method of claim 1, further comprising replacing a port object in the transaction level model description with a protocol pin interface in the register transfer level description.

10. The method of claim 1, wherein the transaction level model description comprises a description of a peripheral component.

11. The method of claim 1, fluffier comprising activating signal drivers in the register transfer level description.

12. A system comprising a processor coupled to a computer readable medium via a bus, wherein said computer readable medium comprises instructions that when executed by said processor implement a method of converting from a transaction level model description to a register transfer level description, said method comprising:
a) accessing a transaction level model description of an integrated circuit;
re-writing the transaction level model description into a synthesizable subset of the transaction level model description including a communication portion comprising timing information and a behavioral portion wherein the communication portion and the behavior portion of the transaction level model description are separate so that the communication portion can be synthesized independently;
b) automatically converting application program interface (API) calls in the synthesizable subset of the transaction level model description to signal accesses in a register transfer level description, wherein said signal accesses have substantially the same semantics as the API calls;
c) automatically generating interface logic in the synthesizable subset of the register transfer level description, said interface logic comprising an interface between a bus interface of the register transfer level description and the signal accesses, wherein the interface logic, includes combinational logic of a signal generator and buffer registers, wherein the buffer registers are modeled as clock methods and the combination logic is modeled as a method sensitive to its and wherein buffer registers are inferred and one or more buffer registers store protocol content to implement a cross-reference to another transfer belonging to a same transaction; and
d) storing said register transfer level description including said signal accesses and said interface logic between said bus interface and said signal accesses in said computer readable medium.

13. The system of claim 12, wherein said method further comprises inferring said buffer registers in the register transfer level description from the transaction level model description, wherein said buffer registers are for storing protocol content.

14. The system of claim 13, wherein said protocol content comprises addresses.

15. The system of claim 12, wherein said method further comprises replacing event sensitivity in the transaction level model description with clock edge sensitivity in the register transfer level description.

16. The system of claim 12, wherein said interface logic is operable to generate signals that are accessible by the signal accesses.

17. The system of claim 16, wherein said interface logic comprises combinational logic that is operable to generate said signals.

18. The system of claim 17, wherein said interface logic, is further operable to generate said signals based on local state.

19. The system of claim 12, wherein said method further comprises replacing a port object in the transaction level model description with a protocol pin interface in the register transfer level description.

20. The system of claim 12, wherein said transaction level model description comprises a description of a peripheral component.

21. The system of claim 12, wherein said method further comprises activating signal drivers in the register transfer level description.

22. A computer readable medium having stored thereon instructions that when executed on a processor implement a method of convening from a transaction level model to a register transfer level, said method comprising:
a) accessing a transaction level model description of an integrated circuit;
re-writing the transaction level model description into a synthesizable subset of the transaction level model description including a communication portion comprising timing information and a behavioral portion wherein the communication portion and the behavior portion of the transaction level model description are separate so that the communication portion can be synthesized independently;
b) automatically convening function calls in the synthesizable subset of the transaction level model description to signal accesses in a register transfer level description;
c) automatically generating interface logic in the synthesizable subset of the register transfer level description said interface logic providing an interface between a bus interface and the signal accesses, wherein the interface logic includes combinational logic of a signal generator and buffer registers, wherein the buffer registers are modeled as clock methods and the combination logic is modeled as a method sensitive to its inputs, and wherein buffer registers are inferred and one or more buffer registers store protocol content to implement a cross-reference to another transfer belonging to a same transaction; and d) storing the register transfer level description including said signal accesses and said interface logic between said bus interface and said signal accesses in said computer readable medium.

23. The computer readable medium of claim 22, wherein said method further comprises inferring said buffer registers in the register transfer level description from the transaction level model description.

24. The computer readable medium of claim 23, wherein said method further comprises replacing event sensitivity in the transaction level model description with clock edge sensitivity in the register transfer level description.

25. The computer readable medium of claim 22, wherein said interface logic is operable to generate signals that are accessible by the signal accesses.

26. The computer readable medium of claim 25, wherein said combinational logic is operable to generate said signals.

27. The computer readable medium of claim 25, wherein said interface logic is operable to generate said signals based on local state.

28. The computer readable medium of claim 24, wherein said method further comprises replacing a port object in the transaction level model description with a protocol pin interface in the register transfer level description.

29. The computer readable medium of claim 28, further comprising analyzing said transaction level model description to determine pin widths in said protocol pin interface.

30. The computer readable medium of claim 29, wherein address and data widths in said protocol pin interface are tailored to match corresponding address and data widths in said port object.

31. The computer readable medium of claim 29, wherein pins widths in said protocol pin interface are minimized based on said analyzing said transaction level model description.

32. The computer readable medium of claim 28, further comprising analyzing said transaction level model description to determine that an optional pin is not required in said protocol pin interface.

33. The computer readable medium of claim 22, wherein said transaction level model description comprises a description of a peripheral component.

34. The computer readable medium of claim 28, wherein said method further comprises activating signal drivers in the register transfer level description.

* * * * *

UNITED STATES PATENT AND TRADEMARK OFFICE
CERTIFICATE OF CORRECTION

| | |
|---|---|
| PATENT NO. | : 8,413,106 B1 |
| APPLICATION NO. | : 10/976402 |
| DATED | : April 2, 2013 |
| INVENTOR(S) | : Serge Goossens |

It is certified that error appears in the above-identified patent and that said Letters Patent is hereby corrected as shown below:

In the Claims:

Col. 15, Claim 1, line 12, replace "butler" with --buffer--.
Col. 15, Claim 11, line 47, replace "fluffier" with --further--.
Col. 15, Claim 12, line 11, insert --inputs-- after "its".
Col. 16, Claim 22, line 50 and line 62, replace "convening" with --converting--.

Signed and Sealed this
Seventeenth Day of September, 2013

Teresa Stanek Rea
*Deputy Director of the United States Patent and Trademark Office*